(12) United States Patent
Malipatil et al.

(10) Patent No.: US 8,860,467 B2
(45) Date of Patent: Oct. 14, 2014

(54) BIASED BANG-BANG PHASE DETECTOR FOR CLOCK AND DATA RECOVERY

(71) Applicant: LSI Corporation, San Jose, CA (US)

(72) Inventors: Amaresh V. Malipatil, San Jose, CA (US); Sunil Srinivasa, Campbell, CA (US); Adam B. Healey, Newburyport, MA (US); Pervez M. Aziz, Dallas, TX (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 13/866,888

(22) Filed: Apr. 19, 2013

(65) Prior Publication Data

US 2014/0266338 A1    Sep. 18, 2014

Related U.S. Application Data

(60) Provisional application No. 61/790,046, filed on Mar. 15, 2013.

(51) Int. Cl.
*G01R 25/00* (2006.01)
*H03L 7/00* (2006.01)

(52) U.S. Cl.
CPC .................................. *H03L 7/00* (2013.01)
USPC ............................................................ 327/3

(58) Field of Classification Search
USPC ....................... 327/2, 3, 5, 7–10, 12
See application file for complete search history.

(56) References Cited

U.S. PATENT DOCUMENTS

| | | | | |
|---|---|---|---|---|
| 4,520,319 A * | 5/1985 | Baker | | 327/5 |
| 5,432,480 A * | 7/1995 | Popescu | | 331/11 |
| 5,577,079 A * | 11/1996 | Zenno et al. | | 375/373 |
| 6,026,134 A * | 2/2000 | Duffy et al. | | 375/376 |
| 6,249,159 B1 * | 6/2001 | Johnson | | 327/157 |
| 7,242,650 B2 * | 7/2007 | Tsai et al. | | 369/47.28 |
| 7,292,662 B2 | 11/2007 | Gregorius | | 375/350 |
| 7,599,461 B2 * | 10/2009 | Aziz et al. | | 375/373 |
| 7,609,798 B2 * | 10/2009 | Eldredge et al. | | 375/371 |
| 7,616,686 B2 * | 11/2009 | Aziz et al. | | 375/233 |
| 7,899,144 B2 * | 3/2011 | Fukuda et al. | | 375/371 |
| 7,916,822 B2 | 3/2011 | Aziz et al. | | 375/373 |
| 8,107,522 B2 * | 1/2012 | Aziz et al. | | 375/233 |
| 8,238,504 B2 * | 8/2012 | Tomita et al. | | 375/371 |
| 8,354,862 B2 * | 1/2013 | Lin et al. | | 327/3 |
| 8,379,711 B2 | 2/2013 | Aziz et al. | | 375/233 |

(Continued)

OTHER PUBLICATIONS

Muller, Keith H., et al., "Timing Recovery in Digital Synchronous Data Receivers," IEEE Transactions on Communications, vol. COM-24, No. 5, May 1976, pp. 516-531.

(Continued)

*Primary Examiner* — Thomas J Hiltunen
(74) *Attorney, Agent, or Firm* — Christopher P. Maiorana, PC

(57) ABSTRACT

An apparatus includes a plurality of phase detector circuits and a summing circuit. Each of the plurality of phase detector circuits may be configured to generate a phase up signal and a phase down signal in response to a respective pair of data samples and intervening transition sample. The summing circuit may be configured to generate an adjustment signal in response to the phase up and phase down signals of the plurality of phase detector circuits. A sum of the phase up signals and a sum of the phase down signals are weighted to provide a bias to a phase adjustment.

11 Claims, 8 Drawing Sheets

(56) References Cited

U.S. PATENT DOCUMENTS

| | | | |
|---|---|---|---|
| 8,509,299 B2* | 8/2013 | Finn et al. | 375/233 |
| 2002/0085656 A1* | 7/2002 | Lee et al. | 375/355 |
| 2009/0074125 A1 | 3/2009 | Lin | 375/375 |
| 2012/0177159 A1* | 7/2012 | Kong et al. | 375/359 |
| 2013/0009679 A1 | 1/2013 | Sindalovsky et al. | 327/147 |

OTHER PUBLICATIONS

Alexander, J. D. H., "Clock Recovery From Random Binary Data," Sep. 26, 1975, Electronics Letters, vol. 11, No. 22, Oct. 30, 1975, pp. 541-542.

* cited by examiner

200 ⤴

| V(K-1) | V(K-1/2) | V(K) | BIASED BBPD OUTPUT (LEFT INNER EYE) | BIASED BBPD OUTPUT (RIGHT INNER EYE) |
|---|---|---|---|---|
| 0 | 0 | 0 | 0 | 0 |
| 0 | 0 | 1 | $+1-\rho$ | $+\rho$ |
| 0 | 1 | 0 | (+1) | (+1) |
| 0 | 1 | 1 | $-\rho$ | $-1+\rho$ |
| 1 | 0 | 0 | $-\rho$ | $-1+\rho$ |
| 1 | 0 | 1 | (+1) | (+1) |
| 1 | 1 | 0 | $+1-\rho$ | $+\rho$ |
| 1 | 1 | 1 | 0 | 0 |

FIG. 3

BIASED BANG-BANG PHASE DETECTOR FOR CLOCK AND DATA RECOVERY

This application relates to U.S. Provisional Application No. 61/790,046, filed Mar. 15, 2013, which is hereby incorporated by reference in its entirety.

FIELD OF THE INVENTION

The invention relates to data recovery generally and, more particularly, to a method and/or apparatus for implementing a biased bang-bang phase detector for clock and data recovery.

BACKGROUND

Clock and Data Recovery (CDR) circuits form a critical part of receivers in serializer-deserializer (SerDes) communication channels. The CDR circuits are used to track the phase of a sampling clock based on some criterion like minimizing mean squared-error (MSE). It is important that the CDR circuits operate well enough to achieve a very low target bit-error rate (BER) on the order of 1e-12 or 1e-15. The CDR circuits in common use can be broadly classified into two categories, baud-rate CDR and bang-bang CDR. There are advantages and disadvantages associated with each category.

In bang-bang (or Alexander) type CDR, a received signal is sampled twice every symbol period, also called a unit interval (UI). Ideally one sample is at a crossing boundary and another sample is at a center of a receiver data eye. Two consecutive data samples (V[K−1] and V[K]) and one transition (or crossing) sample (V[K−½]) between the two data samples are used to decide whether a current sampling phase is lagging or leading an ideal sampling point. The sampling phase is then corrected accordingly. In a CDR circuit using a conventional bang-bang phase detector (BBPD), the phase of a transition sampling clock settles at the median of the jitter distribution after convergence.

SUMMARY

The invention concerns an apparatus includes a plurality of phase detector circuits and a summing circuit. Each of the plurality of phase detector circuits may be configured to generate a phase up signal and a phase down signal in response to a respective pair of data samples and intervening transition sample. The summing circuit may be configured to generate an adjustment signal in response to the phase up and phase down signals of the plurality of phase detector circuits. A sum of the phase up signals and a sum of the phase down signals are weighted to provide a bias to a phase adjustment.

BRIEF DESCRIPTION OF THE FIGURES

Embodiments of the invention will be apparent from the following detailed description and the appended claims and drawings in which:

FIG. 3 is a table illustrating an input/output relationship of the BBPD of FIG. 2;

DETAILED DESCRIPTION OF THE PREFERRED EMBODIMENTS

Embodiments of the invention include method and/or apparatus for implementing a biased bang-bang phase detector (BBPD) in clock and data recovery (CDR) applications. The biased bang-bang phase detector in accordance with embodiments of the invention generally allows convergence to be biased to a right or left inner corner of a receiver data eye depending on a pair of control parameters. In various embodiments, by setting the control parameters to particular values, the phase of a transition sample clock is locked at the inner left corner or inner right corner of the receiver data eye at any desired bit error rate (BER). In various embodiments, a ratio between the two control parameters is set according to the desired BER.

Figure 1:
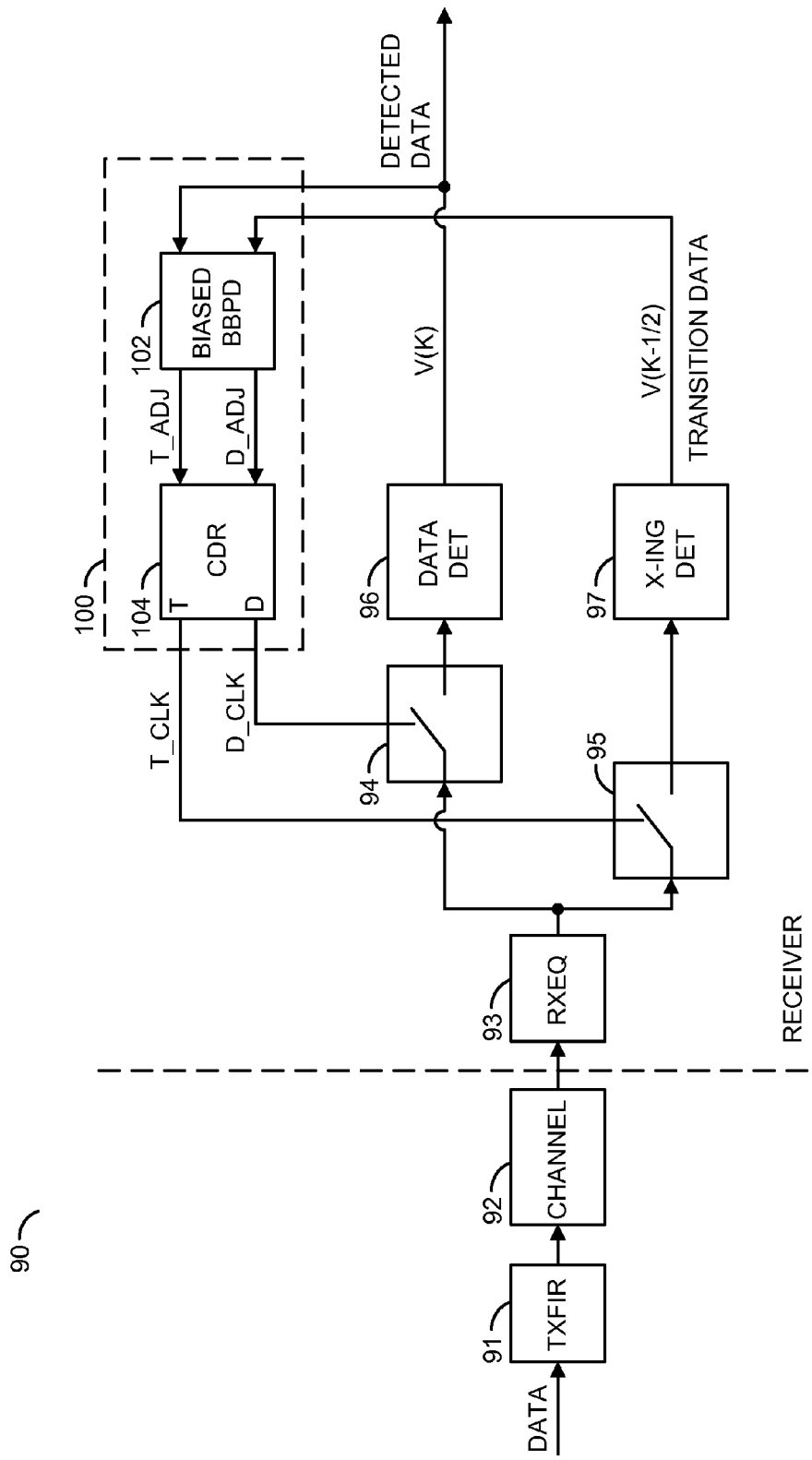
FIG. 1 is a diagram illustrating a communication channel implementing an embodiment of the invention.

Referring to FIG. 1, a block diagram illustrating a serializer/deserializer (SerDes) communication channel 90 including a biased bang-bang phase detector (BBPD) in accordance with an embodiment of the invention is shown. The SerDes channel 90 has a channel impairment that is due, for example, to a physical transmission medium, such as a backplane or drive head in a magnetic recording system. In some embodiments, the channel 90 is generally configured to operate at some predetermined baud-rate. In the exemplary implementation shown in FIG. 1, a signal carrying data (e.g., DATA) is optionally equalized or filtered through a transmit finite impulse response (FIR) filter (TXFIR) 91 prior to being transmitted through a channel 92. After passing through the channel 92, a received signal may optionally be filtered or equalized by a receive equalizer (RXEQ) 93. The RXEQ 93 may be implemented as, for example, a continuous time filter. An output signal of the RXEQ 93 is sampled at the baud rate by a switch 94 using a data sampling clock signal (e.g., D_CLK) and a switch 95 using a transition (or crossing) sampling clock signal (e.g., T_CLK).

In some embodiments, a data detector 96 (or a slicer) digitizes the sample from the switch 94 and compares the digitized sample to an exemplary threshold (e.g., zero), using the clock D_CLK. A crossing detector 97 (or a slicer) digitizes the sample from the switch 95 and compares the digitized sample to an exemplary threshold (e.g., zero), using the clock T_CLK. The sampling clocks (or phases) D_CLK and T_CLK are generated by a clock and data recovery (CDR) circuit 100 based upon detected data (e.g., DETECTED DATA) and transition data (e.g., TRANSITION DATA) generated by the data detector 96 and transition detector 97, respectively. In some embodiments, the circuit 100 comprises a block (or circuit) 102 and a block (or circuit) 104. In various embodiments, the block 102 implements a biased bang-bang phase detector (BBPD) circuit in accordance with embodiments of the invention and the block 104 implements a clock and data recovery loop filter and clock generation circuit.

The phase of the received signal waveform is typically unknown and there may be a frequency offset between the frequency at which the original data was transmitted and the nominal receiver sampling clock frequency. In some embodiments, the function of the CDR circuit 100 is to properly sample the analog waveform of the received signal such that when the sampled waveform is passed through the data detector 96, the data is recovered properly despite the fact that the phase and frequency of the transmitted signal is not known. The CDR circuit 100 is often an adaptive feedback circuit and the feedback loop needs to adjust the phase and frequency of the nominal clock to produce a modified recovered clock that can sample the received signal waveform to allow proper data detection.

In some embodiments, the data detector 96 is implemented as a slicer (e.g., a decision device based on an amplitude threshold) or a more complicated detector such as a sequence detector. For high speed applications, the data detector 96 is often implemented as a slicer that is clocked by the data sampling clock D_CLK from the CDR circuit 100. In some embodiments, in addition to sampling the data signal, the data detector 96 essentially quantizes the signal to a binary "1" or "0" based on the sampled analog value and a slicer threshold (e.g., S). If the input to the data detector 96 at time K is W(K), then the output (e.g., V(K)) of the data detector 96 is given by the following equation:

$$V(K) = 1 \text{ if } W(K) > S$$
$$= 0 \text{ otherwise.}$$

In various embodiments, the CDR circuit 100 may comprise several components, such as a phase detector (PD), a loop filter, and a clock generation circuit. As shown in FIG. 1, the exemplary CDR circuit 100 comprises the phase detector 102 embodied as a biased bang-bang phase detector (BBPD) circuit and the loop filter 104 embodied as a CDR loop filter and clock generator (a digital loop filter). The biased BBPD 102 processes several quantities to compute an estimate of timing adjustments needed to sample the received signal. The timing adjustments for the data sampling clock D_CLK are provided by a data sampling phase adjustment signal (e.g., D_ADJ). In some embodiments, the timing adjustments of the data sampling clock are performed using conventional techniques. The timing adjustments for the transition sampling clock T_CLK are provided by a signal (e.g., T_ADJ). The transition sampling clock T_CLK is normally offset from data sampling clock D_CLK by half of a baud period. In various embodiments, the timing adjustments of the transition sampling clock are performed using the techniques described below.

In some embodiments, the timing adjustments provided by the BBPD 102 are filtered by the CDR loop 104 before adjusting the phase of the sampling clocks D_CLK and T_CLK. The clock D_CLK and the clock T_CLK are generally coupled (e.g., D_ADJ is equal to T_ADJ). For the BBPD 102, there needs to be at least two sampling clocks: a data sampling clock, which samples the detected data, and a transition sampling clock that is offset from the data sampling clock by more or less than half a baud period, which samples the transition data. The transition sample data is denoted as V(K−½) to indicate the transition data is sampled relative to V(K) by a phase offset of around one-half period. In addition, the BBPD 102 makes use of a one baud period delayed version of the detected data (e.g., V(K−1)) (not shown explicitly in FIG. 1). In some embodiments, the delayed data, V(K−1), can be created internally by the BBPD 102 from V(K). In various embodiments, the input/output relationship of the BBPD 102 is characterized by the look up table shown in FIG. 3. Since the BBPD 102 employs more than one sample per baud period, the BBPD 102 is classified as an oversampled phase detector.

Figure 2:
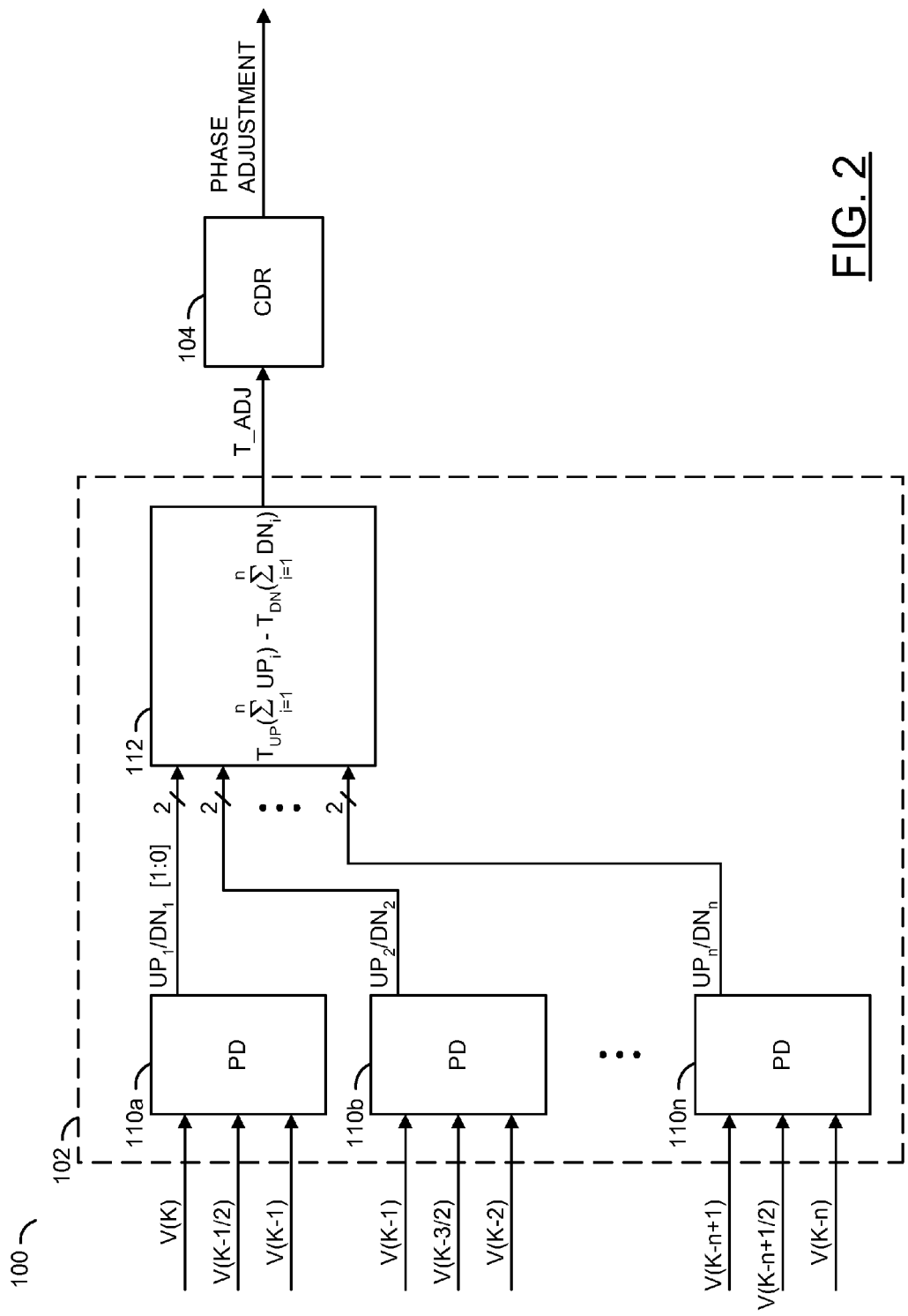
FIG. 2 is a diagram illustrating an example of a bang-bang phase detector (BBPD) implemented in accordance with an embodiment of the invention.

Referring to FIG. 2, a block diagram is shown illustrating an example implementation of the circuit 100 of FIG. 1 in accordance with an embodiment of the invention. In some embodiments, the circuit 102 includes a number of blocks (or circuits) 110a-110n and a block (or circuit) 112. Each of the circuits 110a-110n may be implemented as an oversampled (bang-bang) phase detector (PD). The circuit 110a may present a pair of signals (e.g., UP1, DN1). Similarly, the circuit 110b may present a pair of signals (e.g. UP2, DN2). Each of the circuits 110c-110n may present a respective pair of signals (e.g., UP3, DN3; . . . ; UPn, DNn) accordingly. The circuit 102 may present the signal T_ADJ in the response to a plurality of phase adjust signals (e.g., UP1/DN1, . . . , UPn/DNn) based upon the number of phase detector circuits 110a-110n and a pair of control parameters (e.g., $T_{UP}$ and $T_{DN}$).

The circuit 112 may combine each of the outputs of the circuits 110a-110n to generate the signal T_ADJ. By combining the outputs of the circuits 110a-110n, the circuit 112 integrates the phase decisions made by the circuits 110a-110n across a number, n, of symbol periods. In some embodiments, the input/output relationship of the block 112 may be expressed using the following equation:

$$T\_ADJ = T_{UP}\left(\sum_{i=1}^{n} UP_i\right) - T_{DN}\left(\sum_{i=1}^{n} DN_i\right)$$

In various embodiments, the signal T_ADJ is used to control the phase of the transition sampling clock directly. In some embodiments, the signal T_ADJ is used to control the phase of the transition sampling clock via the CDR loop 104.

Referring to FIG. 3, a diagram of a lookup table 200 illustrating an input/output relationship of the phase detector 102 of FIG. 2. The value of ρ is based on a target bit error rate (BER). The target BER is set by the ratio of the control parameter $T_{UP}$ to the control parameter $T_{DN}$ (e.g., $T_{UP}/T_{DN}$). When the control parameter $T_{UP}$ is greater than the control parameter $T_{DN}$, the phase of the transition sampling clock is biased towards the right inner corner of the receiver eye. By setting the control parameter $T_{UP}$ equal to the control parameter $T_{DN}$, the circuit 112 can be made to operate like a classical bang-bang phase detector.

Figure 4:
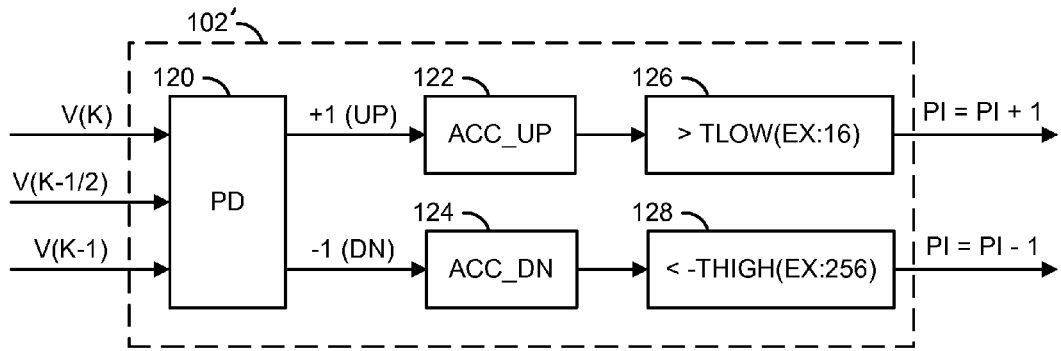
FIG. 4 is a diagram illustrating another example of a bang-bang phase detector (BBPD) implemented in accordance with an embodiment of the invention and configured to lock a phase of a transition sampling clock to a right inner corner of a receiver data eye.
Figure 5:
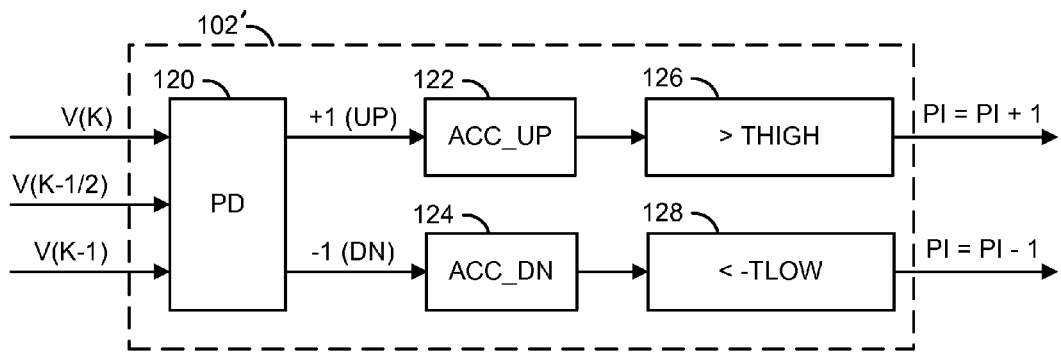
FIG. 5 is a diagram illustrating the BBPD of FIG. 4 configured to lock the phase of the transition sampling clock to a left inner corner of a data eye.

Referring to FIGS. 4 and 5, diagrams of a circuit 102' are shown illustrating another example implementation of the biased bang-bang phase detector (BBPD) 102 of FIG. 1 in accordance with an embodiment of the invention. Depending upon the setting of a positive threshold value and a negative threshold value of the BBPD 102', the phase of the transition sampling clock can be biased towards the right inner corner of the receiver eye (FIG. 4) or the left inner corner of the receiver eye (FIG. 5).

In some embodiments, the biased bang-bang phase detector 102' comprises an oversampled phase detector (PD) 120, an up decision accumulator block (ACC_UP) 122, a down decision accumulator block (ACC_DN) 124, a compare block 126, and a compare block 128. The accumulator blocks 122 and 124 integrate respective phase adjustment decisions (e.g., UP or DN) from the phase detector 120 over a number (e.g., 8, 16, etc.) of symbol periods. The compare block 126 determines whether the accumulated value of up decisions exceeds (e.g., is greater than) a predetermined positive threshold value (e.g., T_POS). The compare block 128 determines whether the accumulated value of down decisions exceeds (e.g., is less than) a predetermined negative threshold value (e.g., T_NEG). An output of the block 126 and an output of the block 128 are used to adjust the phase of the transition sampling clock. For example, in some embodiments, the output of the block 126 is used to increment a phase interpolator code (e.g., PI) and the output of the block 128 is used to decrement the phase interpolator code PI. In various embodiments, the phase of the transition sampling clock may be selected in response to the phase interpolator code. For example, in some embodiments, a voltage controlled oscillator (VCO) and a phase interpolator (PI) or a phase selection circuit (PSC) may be implemented as part of a CDR loop filter and clock generating module (e.g., the block 104 in FIG. 1). The VCO may be configured to generate multiphase clocks that may be used by the phase interpolator or the phase selection circuit to produce the transition sampling clock according to the phase interpolator code.

In various embodiments, the bias of the BBPD 102' is determined by two control parameters THIGH and TLOW. For example, THIGH is set greater than TLOW for biased bang-bang phase detector operation and THIGH is set equal to TLOW for classical bang-bang phase detector operation. The ratio THIGH/TLOW is generally set based upon a target bit error rate (BER). In some embodiments, THIGH has a value of 256 and a lower value (e.g., 1, 16, 64, etc.) is selected for TLOW based upon the target BER.

In various embodiments and/or operation scenarios, when the magnitude of the predetermined negative threshold T_NEG is set to THIGH (e.g., T_NEG=-THIGH) and the magnitude of the predetermined positive threshold T_POS is set to TLOW (e.g., T_POS=TLOW), the BBPD 102' is biased towards the right inner corner (or up). When the magnitude of the predetermined positive threshold is set to THIGH (e.g., T_POS=THIGH) and the magnitude of the predetermined negative threshold is set to TLOW (e.g., T_NEG=-TLOW), the BBPD 102' is biased towards the left inner corner (or down). Although the examples presented illustrate setting a bias to lock a phase transition sampling clock to an inner corner of a receiver eye, the bias may bias may also be set arbitrarily to meet a design criterion of a particular application.

Figure 6:
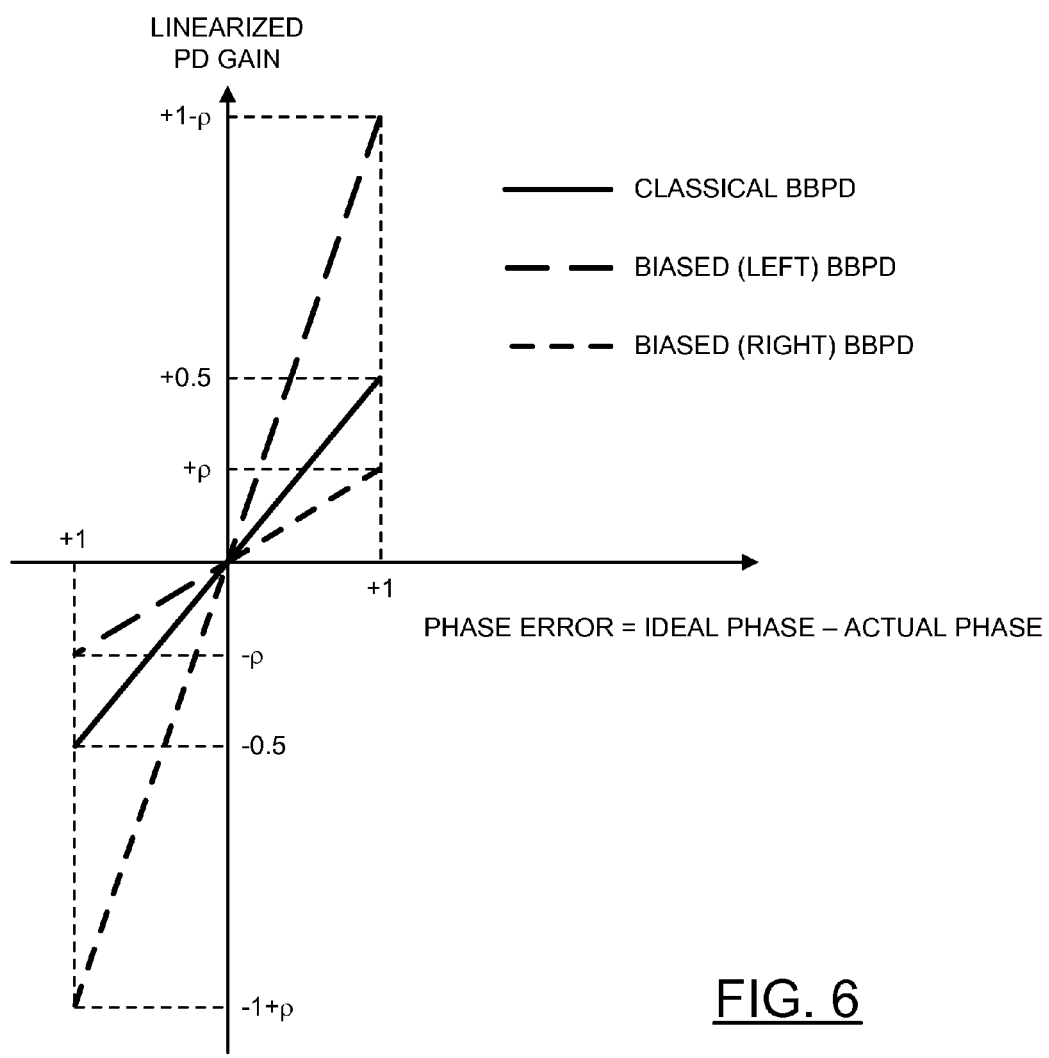
FIG. 6 is a diagram illustrating a gain versus phase error relationship for various threshold settings in a bang-bang phase detector implemented in accordance with an embodiment of the invention.

Referring to FIG. 6, a diagram is shown illustrating an exemplary linearized gain versus phase error relationship for various threshold settings in a bang-bang phase detector implementing a biasing scheme in accordance with an embodiment of the invention.

Figure 7:
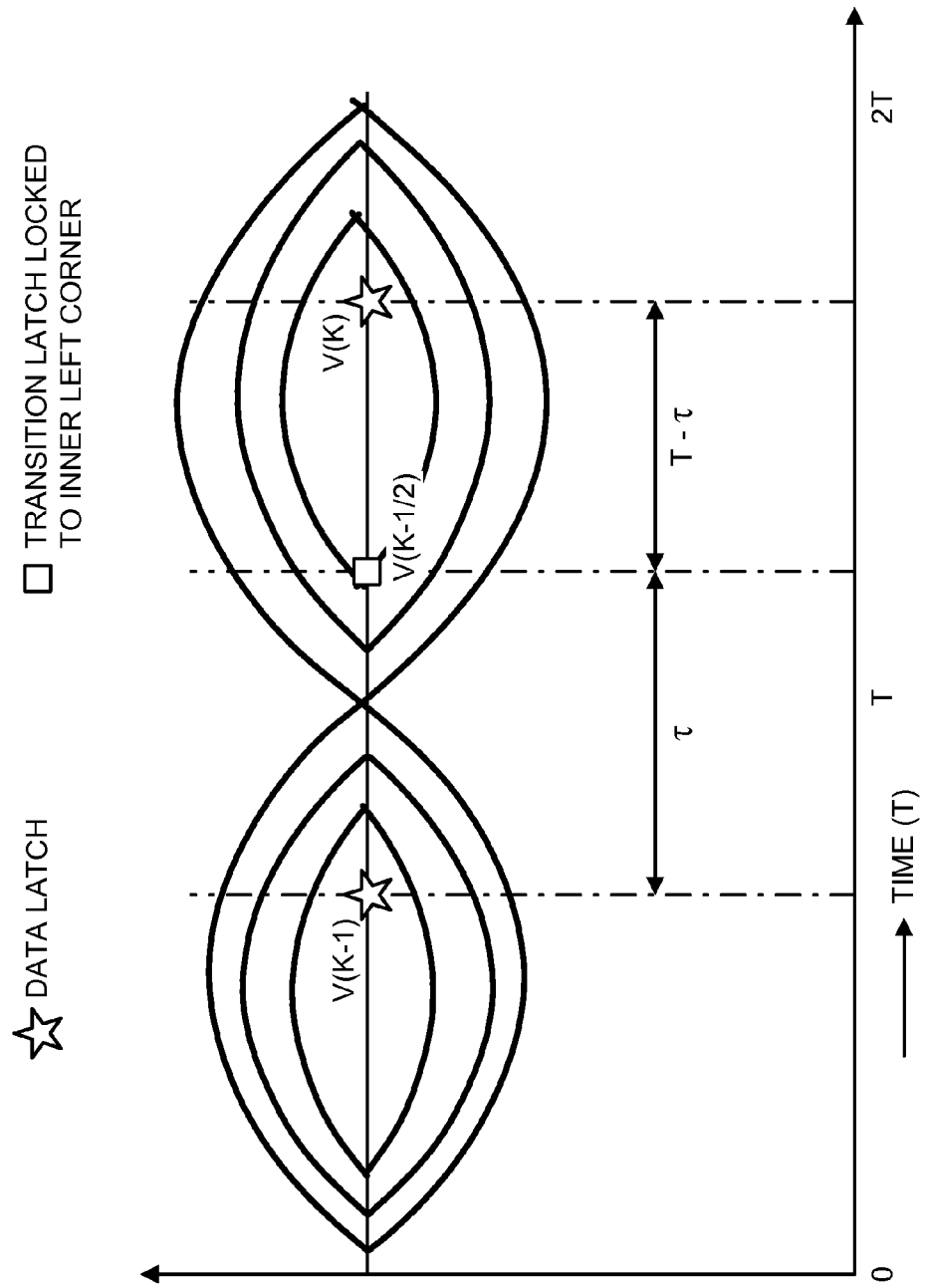
FIG. 7 is a diagram illustrating a transition sampling phase settling at a left inner corner of the receiver data eye.

Referring to FIG. 7, a diagram is shown illustrating the phase of the transition sampling clock settling at a left inner corner of the receiver data eye. The time interval between V(K−1) and V(K−½) is equal to τ. The time interval between V(K−½) and V(K) is equal to T−τ.

Figure 8:
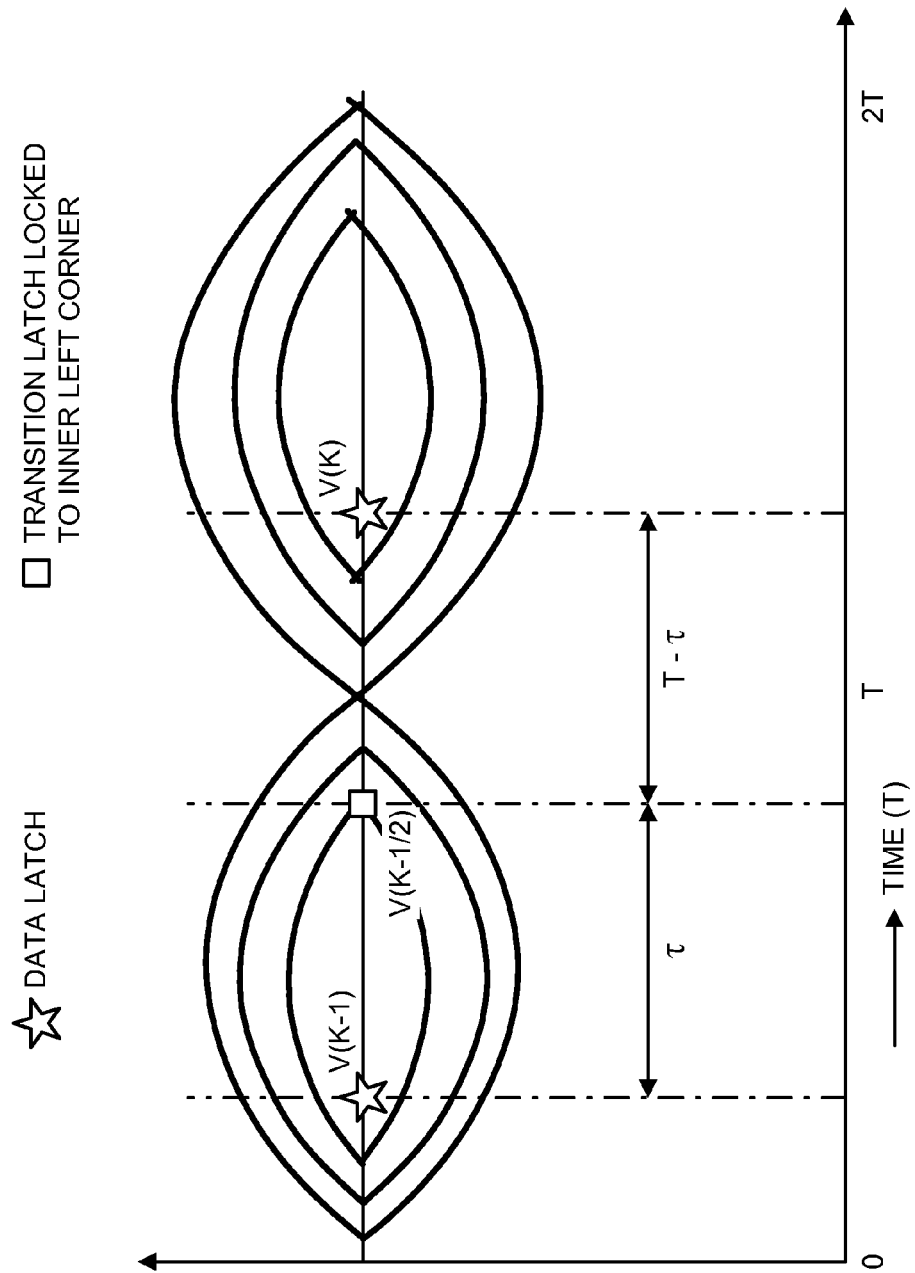
FIG. 8 is a diagram illustrating a transition sampling phase settling at a right inner corner of the receiver data eye.

Referring to FIG. 8, a diagram is shown illustrating the phase of the transition sampling clock settling at a right inner corner of the receiver data eye. Similar to FIG. 7, in FIG. 8 the time interval between V(K−1) and the V(K−½) is equal to τ. The time interval between V(K−½) and V(K) is equal to T−τ.

Figure 9:
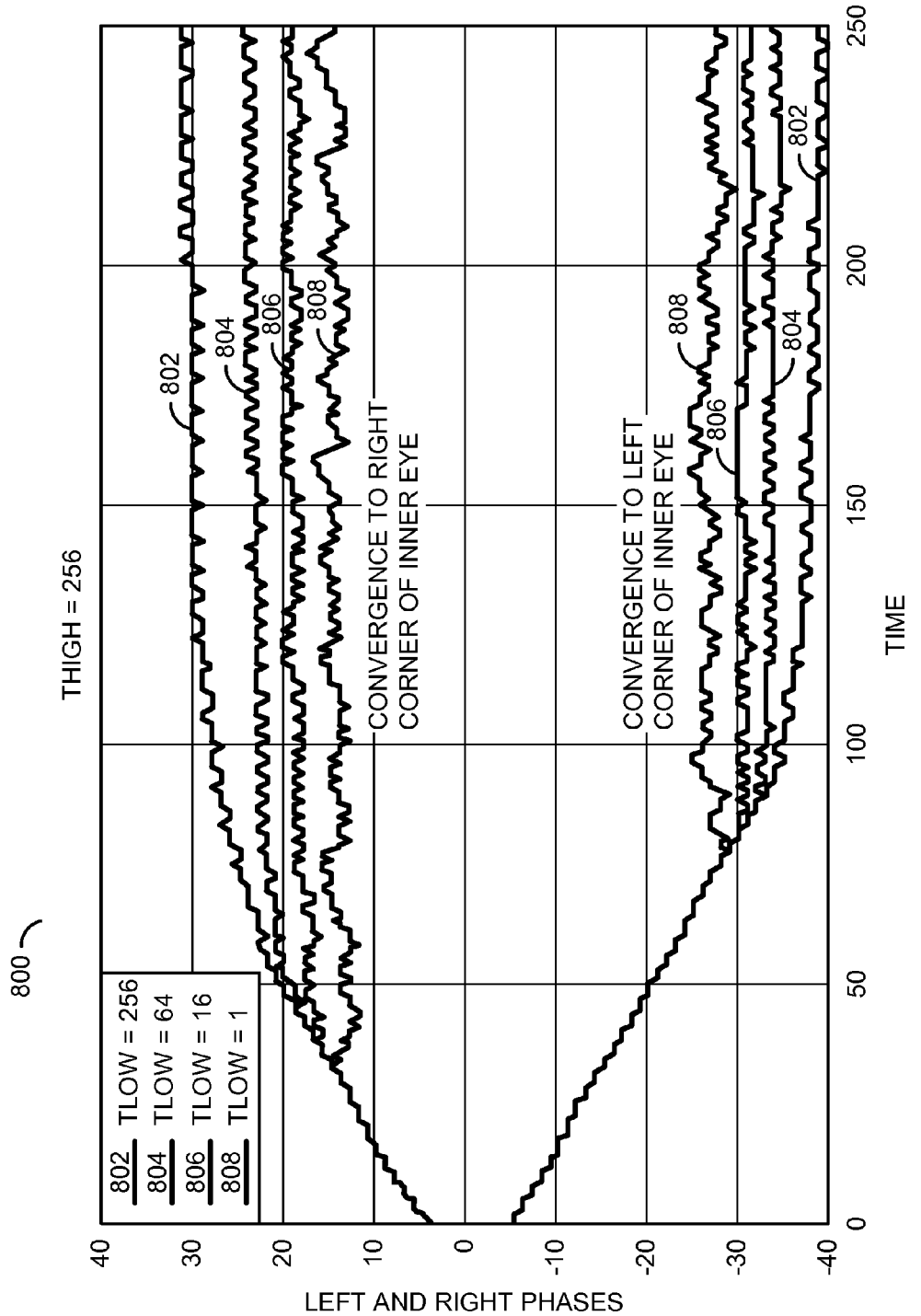
FIG. 9 is a diagram illustrating phase convergence behavior of the phase of the transition sampling clock for various threshold values.

Referring to FIG. 9, a diagram of a graph 800 is shown illustrating phase convergence behavior of the phase of the transition sampling clock for various threshold values. A curve 802 illustrates the phase convergence behavior of a biased bang-bang phase detector in accordance with an embodiment of the invention when both control parameters THIGH and TLOW are set to 256. A curve 804 illustrates the phase convergence behavior of a biased bang-bang phase detector in accordance with an embodiment of the invention when the control parameter THIGH is set to 256 and the control parameter TLOW is set to 64. A curve 806 illustrates the phase convergence behavior of a biased bang-bang phase detector in accordance with an embodiment of the invention when the control parameter THIGH is set to 256 and the control parameter TLOW is set to 16. A curve 808 illustrates the phase convergence behavior of a biased bang-bang phase detector in accordance with an embodiment of the invention when the control parameter THIGH is set to 256 and the control parameter TLOW is set to 1.

A clock and data recovery (CDR) circuit in a receiver of a communication system such as a SerDes (serializer-deserializer) aids in acquisition and tracking of the optimal sampling phase needed for proper operation of the receiver and meeting the bit error rate (BER) performance targets. In various embodiments, the CDR circuit is driven by a phase detector that provides the gradient for the direction in which the phase needs to be adjusted. The direction of any necessary phase update is made by considering a current data sample (e.g., V(K)), a previous data sample (e.g., V(K−1)), and a transition (e.g., V(K−½)) sample.

For a classical bang-bang phase detector (BBPD), the UP (move right) and DN (move left) are equally weighted. Hence, after convergence Prob(V(K−½)=V(K−1))=Prob(V(K−½)=V(K))=0.5. In order to lock the transition sampling phase at the inner left corner at BER=ρ, the samples V(K−½)=V(K) need to match with probability 1−ρ. Hence, the sample V(K−½) is moved to the right with weight 1−ρ and moved to the left with weight ρ.

In various embodiments, the weights with which the CDR phase moves to the left or the right are determined by a pair of control parameters THIGH and TLOW. The ratio THIGH/TLOW represents the target BER for locking the transition sample latch to a particular inner eye corner. When THIGH equals TLOW, the 'conventional' BBPD relationship is obtained; moving in or out of the eye is equally probable. A higher ratio THIGH/TLOW means that the eye corners are found more accurately (lower ρ), but the convergence time for the phase is longer.

The terms "may" and "generally" when used herein in conjunction with "is(are)" and verbs are meant to communicate the intention that the description is exemplary and believed to be broad enough to encompass both the specific examples presented in the disclosure as well as alternative examples that could be derived based on the disclosure. The terms "may" and "generally" as used herein should not be construed to necessarily imply the desirability or possibility of omitting a corresponding element.

While the invention has been particularly shown and described with reference to embodiments thereof, it will be understood by those skilled in the art that various changes in form and details may be made without departing from the scope of the invention.

The invention claimed is:

1. An apparatus comprising:
    a plurality of phase detector circuits each configured to generate a phase up signal and a phase down signal in response to a respective pair of data samples and intervening transition samples; and
    a summing circuit configured to generate an adjustment signal in response to said phase up and phase down signals of said plurality of phase detector circuits, wherein a sum of said phase up signals and a sum of said phase down signals are weighted to provide a bias to a phase adjustment, wherein said adjustment signal is based on a difference between said sum of said phase up signals weighted by a first control parameter and said sum of said phase down signals weighted by a second control parameter.

2. The apparatus according to claim 1, wherein said bias is set based on a target bit error rate of an inner eye.

3. The apparatus according to claim 1, wherein said phase up signals are weighted by said first control parameter, said phase down signals are weighted by said second control parameter, and a ratio of said first control parameter and said second control parameter is set based on a target bit error rate of an inner eye.

4. The apparatus according to claim 1, further comprising:
a loop filter and clock generation circuit configured to adjust a phase of a transition sampling clock according to said adjustment signal.

5. The apparatus according to claim 1, further comprising:
at least one data detector configured to generate said data samples in response to a received signal and a data sampling clock; and
at least one transition detector configured to generate said intervening transition samples in response to said received signal and a transition sampling clock, wherein a phase of said transition sampling clock is adjusted according to said adjustment signal.

6. The apparatus according to claim 1, further comprising:
at least one data detector configured to generate said data samples in response to a received signal and a data sampling clock;
at least one transition detector configured to generate said intervening transition samples in response to said received signal and a transition sampling clock; and
a loop filter and clock generation circuit configured to adjust a phase of said transition sampling clock according to said adjustment signal.

7. An apparatus comprising:
a first sampling circuit configured to generate detected data in response to a data sampling clock;
a second sampling circuit configured to generate transition data in response to a transition sampling clock;
a phase detector circuit configured to generate a first phase adjustment signal and a second phase adjustment signal in response to said detected data, said transition data, a first control parameter and a second control parameter, wherein (A) a point at which a phase of said transition sampling clock settles after convergence is biased from a median value of a receiver eye jitter distribution based on a target bit error rate of an inner eye, (B) said first control parameter sets a threshold limit for increasing said phase of said transition sampling clock, and (C) said second control parameter sets a threshold limit for decreasing said phase of said transition sampling clock.

8. The apparatus according to claim 7, wherein an amount of bias is selected based on said target bit error rate (BER).

9. The apparatus according to claim 7, wherein said first and said second control parameters are programmable.

10. The apparatus according to claim 7, wherein said phase detector circuit comprises:
an oversampled phase detector configured to generate a first control signal for increasing said phase of said transition sampling clock and a second control signal for decreasing said phase of said transition sampling clock;
a first accumulator configured to generate a first filtered control signal in response to said first control signal;
a second accumulator configured to generate a second filtered control signal in response to said second control signal;
a first comparator configured to generate said first phase adjustment signal in response to said first filtered control signal and said first control parameter;
a second comparator configured to generate said second phase adjustment signal in response to said second filtered control signal and said second control parameter.

11. An apparatus comprising:
a plurality of phase detector circuits each configured to generate a phase up signal and a phase down signal in response to a respective pair of data samples and intervening transition samples; and
a summing circuit configured to generate an adjustment signal in response to said phase up and phase down signals of said plurality of phase detector circuits, wherein a sum of said phase up signals and a sum of said phase down signals are weighted to provide a bias to a phase adjustment, wherein (i) said phase up signals are weighted by said first control parameter, (ii) said phase down signals are weighted by said second control parameter, and (iii) a ratio of said first control parameter and said second control parameter is set based on said target bit error rate of said inner eye.

* * * * *